United States Patent [19]
Chen et al.

[11] Patent Number: 5,675,185
[45] Date of Patent: Oct. 7, 1997

[54] SEMICONDUCTOR STRUCTURE INCORPORATING THIN FILM TRANSISTORS WITH UNDOPED CAP OXIDE LAYERS

[75] Inventors: Bomy Able Chen, Hopewell Junction; Subhash Balakrishna Kulkarni, Peekskill, both of N.Y.; Jerome Bret Lasky, Essex Junction, Vt.; Randy William Mann, Jericho, Vt.; Edward Joseph Nowak, Essex Junction, Vt.; Werner Alois Rausch, Stormville, N.Y.; Francis Roger White, Essex Junction, Vt.

[73] Assignee: International Business Machines Corporation, Armonk, N.Y.

[21] Appl. No.: 537,219

[22] Filed: Sep. 29, 1995

[51] Int. Cl.[6] ............... H01L 23/48; H01L 23/52; H01L 29/40
[52] U.S. Cl. ............... 257/774; 257/752; 257/758; 257/759
[58] Field of Search ............... 257/750, 734, 257/637, 751, 752, 754, 774, 758, 759

[56] References Cited

U.S. PATENT DOCUMENTS

| 5,117,273 | 5/1992 | Stark et al. | 257/734 |
| 5,155,058 | 10/1992 | Fujiwara et al. | 437/52 |
| 5,156,987 | 10/1992 | Sandhu et al. | 437/40 |
| 5,278,459 | 1/1994 | Matsui et al. | 307/291 |
| 5,317,192 | 5/1994 | Chen et al. | 257/750 |
| 5,330,929 | 7/1994 | Pfiester et al. | 437/52 |
| 5,334,862 | 8/1994 | Manning et al. | 257/67 |
| 5,334,863 | 8/1994 | Ohkawa et al. | 257/69 |
| 5,343,066 | 8/1994 | Okamoto et al. | 257/393 |
| 5,485,035 | 1/1996 | Lin et al. | 257/637 |

*Primary Examiner*—Carl W. Whitehead
*Attorney, Agent, or Firm*—Heslin & Rothenberg, P.C.

[57] ABSTRACT

An improved field effect transistor (FET) structure is disclosed. It comprises a first insulator layer containing at least one primary level stud extending through the layer; an undoped cap oxide layer disposed over the insulator layer and abutting the upper region of each stud; a primary level thin film transistor (TFT) disposed over the undoped cap oxide layer; and a planarized oxide layer disposed over the TFT. Multiple TFT's can be stacked vertically, and connected to other levels of studs and metal interconnection layers. Another embodiment of the invention includes the use of a protective interfacial cap over the surface of tungsten-type studs. The FET structure can serve as a component of a static random access memory (SRAM) cell. Related processes are also disclosed.

24 Claims, 10 Drawing Sheets

SEMICONDUCTOR STRUCTURE INCORPORATING THIN FILM TRANSISTORS WITH UNDOPED CAP OXIDE LAYERS

TECHNICAL FIELD

The present invention relates generally to microelectronic devices, and more particularly, to novel semiconductor structures which include thin film transistors, such as static random access memory cells.

BACKGROUND ART

Thin film transistors (TFT's) are becoming popular in the effort to reduce the cell size of various semiconductor devices, thereby conserving valuable space on the semiconductor chip surface. The use of TFT's is generally described, for example, in U.S. Pat. No. 5,156,987 of Sandhu et al., and U.S. Pat. No. 5,278,459 of Matsui et al.

As one example, TFT's are finding use as elements of static random access memory cells (SRAM's), which are very common and important devices in microelectronic structures. Because of the ever-increasing number of features intended for the dimension of a typical silicon chip surface, SRAM's are being utilized in arrays of steadily-increasing density. The miniaturization of these features eventually reaches the boundaries of lithographic capabilities.

However, potential problems can arise when trying to incorporate TFT's into existing chip fabrication technology. The steps needed to form the TFT can interfere with existing front-end-of-the-line (FEOL) and back-end-back-of-the-back-line (BEOL) processes for preparing integrated circuit structures. As an example, fabrication of TFT's often involves high temperature steps, e.g., annealing at temperatures of 800° C. or higher. Temperatures of that level could damage the features prepared in FEOL or BEOL processes.

Furthermore, the addition of the TFT to existing products having pre-designed configurations can be extremely difficult, if not impossible. Any modifications needed in the "host" device to accommodate the TFT can be costly and time-consuming.

It's thus apparent that a need still exists for a method of increasing the density of features within a semiconductor device, without adversely affecting any of the features already formed in the device, such as field effect transistors (FET's). Moreover, the actual incorporation of the TFT into the host structure (for example, an SRAM) should not involve complicated steps which decrease manufacturing productivity and increase overall costs. Finally, the overall performance of the device should be maintained or increased with the addition of the TFT, in terms of processing speed and on/off current ratios, for example.

DISCLOSURE OF INVENTION

The needs discussed above have been satisfied by the discovery of an improved FET structure, comprising:

a) a first insulator layer containing at least one primary level stud extending through the layer;

b) an undoped cap oxide layer disposed over the insulator layer, and abutting the upper region of each stud;

c) a primary level thin film transistor disposed over the undoped cap oxide layer; and d) a planarized dielectric layer disposed over the thin film transistor.

Multiple TFT's can be stacked vertically, and connected to other levels of studs and metal interconnection layers. The FET structure can serve as a component of an SRAM cell.

Another embodiment of the invention includes the use of a protective interfacial cap over the surface of the studs. Related processes are also disclosed.

DETAILED DESCRIPTION OF THE INVENTION

As used herein, "FET structure" is defined as any integrated circuit device which contains at least one FET. Those skilled in the art understand that such devices usually are based on an assembly of electrically isolated circuit elements, e.g., both active semiconductor devices and passive components, together with electrically conducting interconnections.

Figure 1:
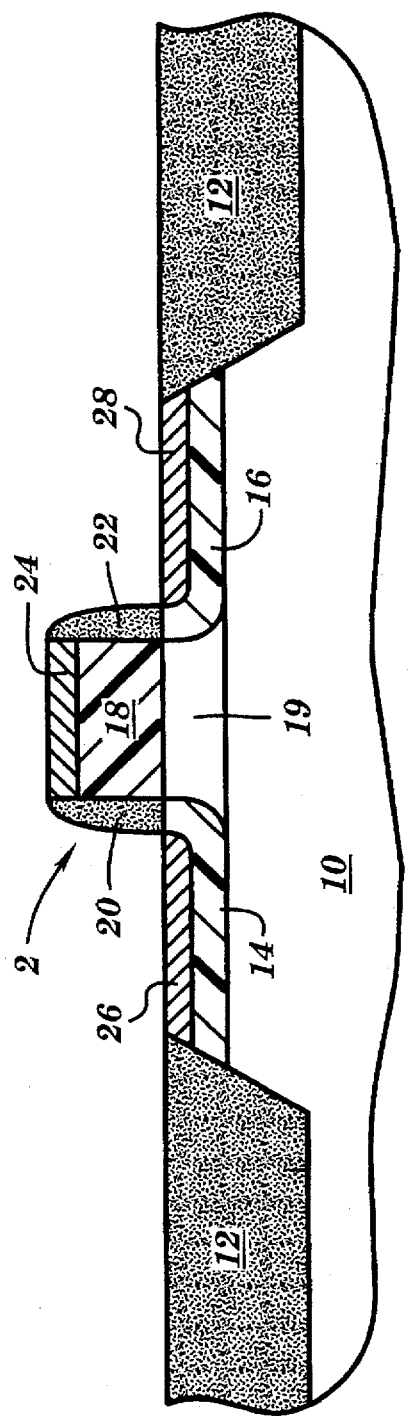
FIGS. 1–10 represent cross-sectional views of one embodiment for the preparation of an FET structure based on the present invention.

FIG. 1 represents a cross-section of a conventional circuit element 2, e.g., an n-FET or p-FET. In general, p-FET devices are preferred, but the present invention is applicable to either type of device. The transistor is usually formed on or within an insulator layer 12 which has been deposited on a single crystal silicon substrate 10. As known in the art, the transistor includes source and drain regions 14 and 16 (which are interchangeable in terms of position within the transistor). Gate 18 is often situated between spacers 20 and 22. Conductive regions 26 and 28 are usually formed over at least a portion of the source and drain regions, while conductive layer 24 lies on top of the upper surface of gate 18. These conductive regions may be formed of any conventional material, e.g., metal silicides like titanium silicide. Fabrication techniques for circuit element 2 and the surrounding features are well-known in the art, and described, for example, by S. M. Sze in *VLSI Technology*, 2nd Edition, McGraw-Hill Publishing Co., 1988. Some of these techniques will be described below with reference to the formation of other elements of this invention.

Figure 2:
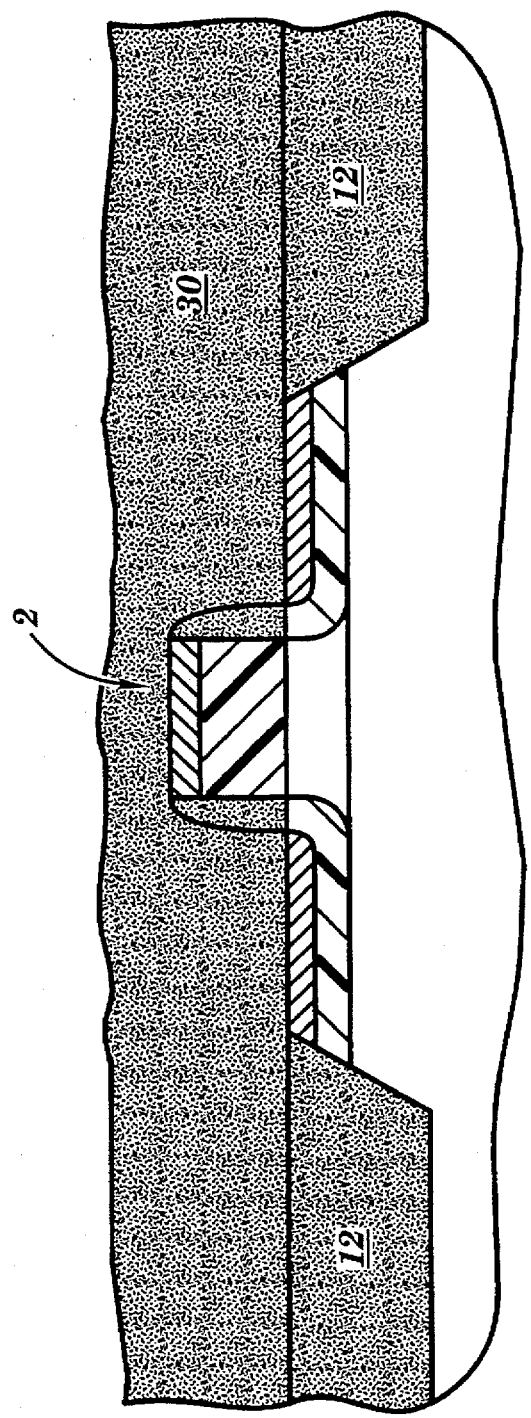

Conventional circuit element 2 is an example of an active electrical element in a microelectronic device, such as an SRAM. It will sometimes be referred to herein as the "base transistor" because of its position relative to the substrate. While circuit element 2 is present in some embodiments of this invention, it is not a critical feature. Instead of a transistor, it could be any other active element situated on the substrate, e.g., a resistor, capacitor, or diode. In preparing a semiconductor structure according to this invention, an insulator layer 30 is usually first deposited over insulator layer 12 and over the exposed surface of the active electrical element, e.g., circuit element 2, as depicted in FIG. 2. Various materials can be used for the insulator layer, such as oxide materials, nitride materials, or glass. Glass is often the material of choice. Phosphosilicate glass (PSG) is preferred, but borophosphosilicate glass (BPSG) may also be used. The glass material can be deposited by conventional techniques, such as chemical vapor deposition (CVD), which is usually performed for this type of structure at a temperature of about 600° C. to about 800° C. Plasma-enhanced chemical vapor deposition (PECVD) is often preferred for depositing glass. In that instance, the deposition temperature would be in the range of about 400° C. to about 500° C.

Figure 3:
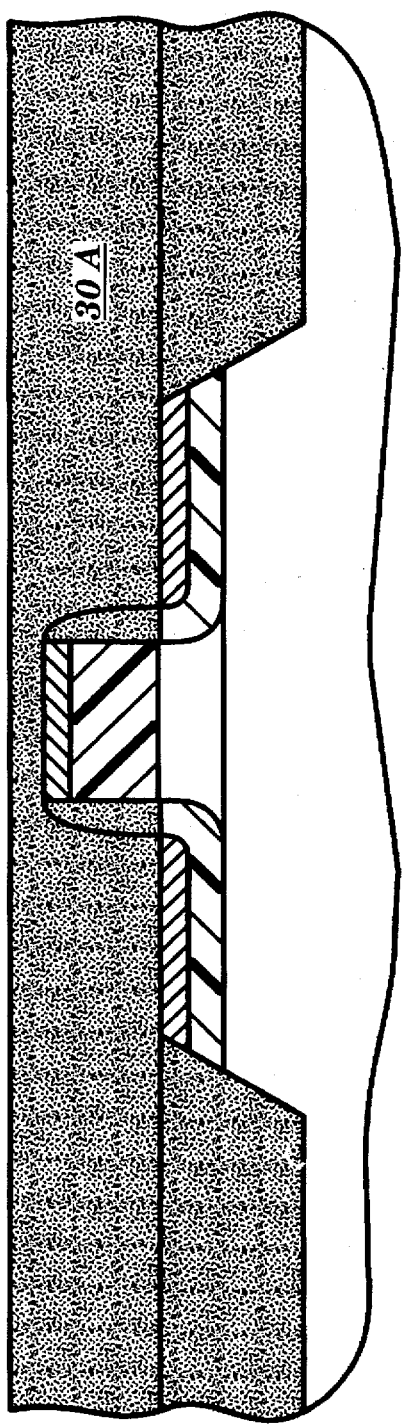

After being deposited, insulator layer 30 is planarized. One way to planarize is known as chemical-mechanical polishing (CMP), which is described in the following U.S. patents, all of which are incorporated herein by reference. U.S. Pat. No. 5,292,689; U.S. Pat. No. 5,234,868; U.S. Pat. No. 4,944,836; and U.S. Pat. No. 4,910,155. In brief, CMP involves the use of a polishing pad and slurry to grind down the surface. The CMP slurry usually contains small particles of a controlled size, e.g., silicon dioxide particles, dispersed in solution. The liquid portion of the solution acts as both a lubricant and a travel medium for the polishing particles. As planarized, insulator layer 30A (shown in FIG. 3) usually has a thickness in the range of about 5000 Angstroms to about 8000 Angstroms.

Figure 4:
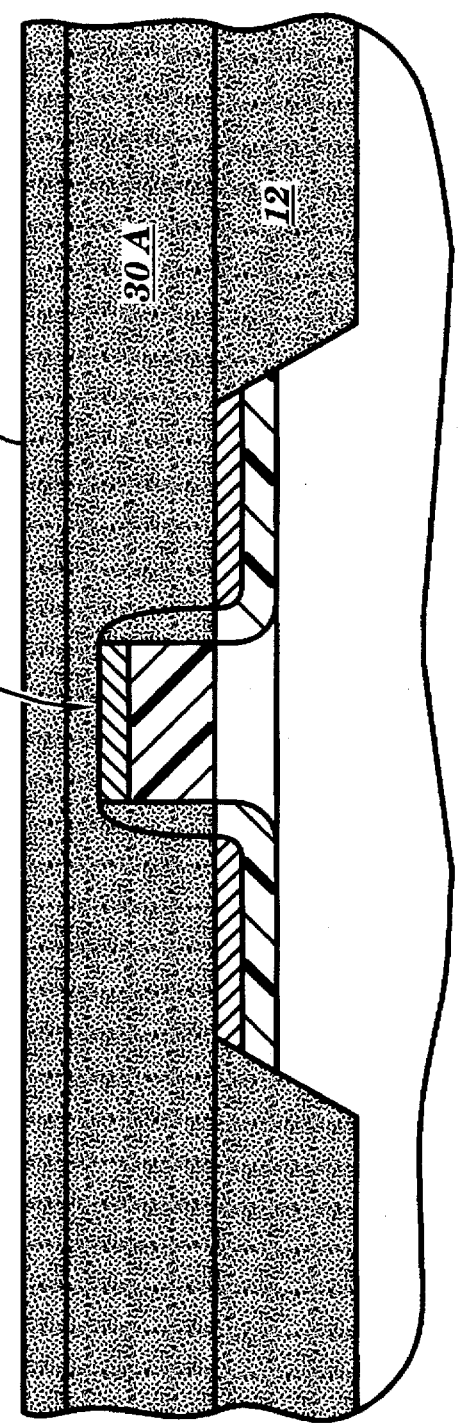
Figure 5:
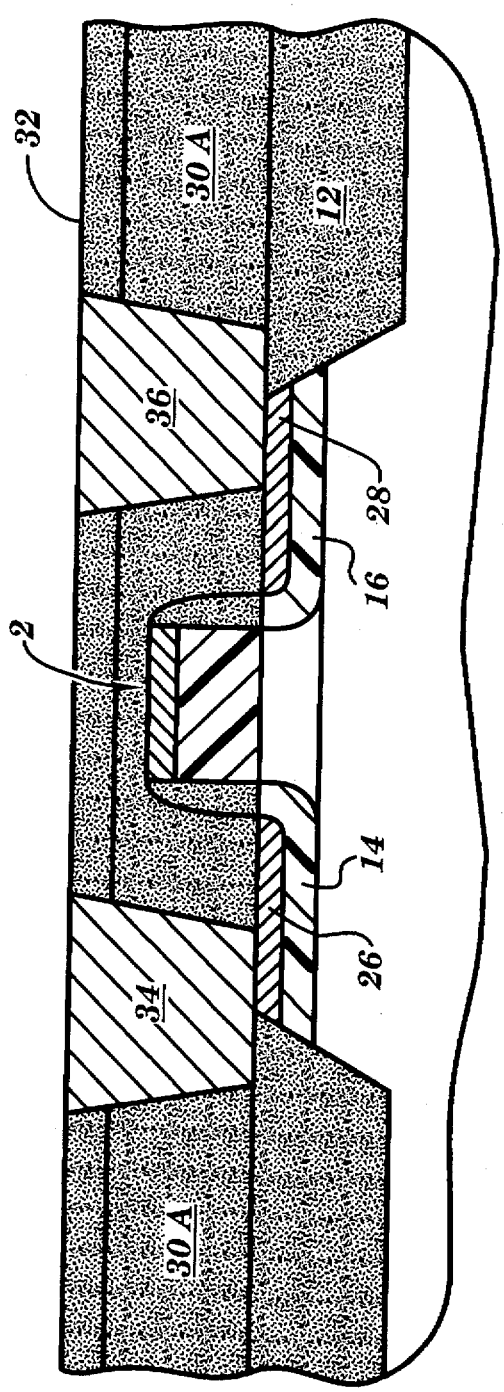

Cap oxide layer 32, which is undoped, is then applied over planarized insulator 30A, as depicted in FIG. 4. Cap layer 32 is very important for the present invention. It prevents any phosphorous in the insulator layer material from diffusing into the polysilicon layer which will subsequently be applied, since diffusion could result in the counter-doping of the ions which will be implanted into the polysilicon layer. Cap oxide layer 32 can be deposited by CVD, e.g., in the form of tetraethoxy silane (TEOS). It usually has a thickness in the range of about 500 Angstroms to about 1500 Angstroms. After the cap oxide layer has been deposited, one or more studs are formed. The studs provide electrical interconnection between various active elements in the device. In FIG. 5, which represents an exemplary embodiment, 34 and 36 are considered to be "primary level" studs because they are situated at the level of the device closest to the lowest active element, i.e., circuit element 2.

As shown in FIG. 5, the studs usually extend through cap oxide layer 32 and insulator layer 30A. The lower end or terminus of the stud may be connected to an active electrical device. For example, the figure depicts each stud connected to conductive layers 26 or 28, which are in turn each connected to a source or drain region 14, 16 of circuit element 2. Alternatively, the lower terminus of each stud does not have to be connected to the active electrical element, but can instead simply be embedded in any other area of insulator layer 12. The particular connection points for each stud will of course be determined by the overall circuit configuration of the SRAM device.

The studs are usually formed of a refractory metal like tungsten or molybdenum. Alloys of refractory metals are also possible, e.g., tungsten alloys. The shape of the stud is not critical to the present invention, and will depend on various factors, such as the overall dimensions of the device, the technique used to form the stud (e.g., the tool settings), and the relevant photolithographic capabilities. The stud is usually in the shape of an elongate cylinder, i.e., a substantially round post, having a diameter in the range of about 0.4 micron to about 0.8 micron. Alternatively, the stud could be in the shape of a vertical bar or a line of metal, for example. The height of the stud is usually in the range of about 0.4 micron to about 1.0 micron. Those skilled in the art understand that these dimensions will probably decrease for the next generation of microelectronic devices.

The studs can be put into place by techniques known in the art. For example, a suitable photoresist can be applied over cap oxide layer 32, using a mask, followed by imaging and developing. The steps are repeated for insulator layer 12. Those skilled in the art understand that layers 30A and 32 can usually be patterned and imaged simultaneously, depending on the materials forming each layer. Standard etching techniques (e.g., reactive ion etching) are employed to form the desired recess for each stud. The studs themselves can then be deposited by conventional CVD techniques. As an example, in the case in which the studs are to be tungsten, $WF_6$ can be reduced in a hydrogen atmosphere, using a GENUS deposition tool. A layer of tungsten having a thickness of about 4000 Angstroms to about 12,000 Angstroms can be formed in this manner. It is then polished back and planarized, using the CMP technique described above, for example.

It is sometimes advantageous to utilize a liner for the stud, e.g., in those circumstances in which very good electrical conductivity between the base of the stud and the underlying surface needs to be maintained. As an example in the case of a tungsten stud, a relatively thin layer of a refractory metal like titanium could be deposited conformally by conventional means within the stud recess, followed by the conformal deposition of a thicker layer of another conductor material, e.g., titanium nitride. The thickness of the titanium-type layer would usually be in the range of about 100 to 200 Angstroms, while the thickness of the titanium nitride-type layer would usually be in the range of about 500 Angstroms to about 700 Angstroms. These layers are not specifically depicted in the drawings, but their optional presence for some embodiments should be noted. Thus, for a connection between the lower surface of a stud and an underlying element as described herein, it should be recognized that the interface might technically be made through one or more liner-layers, e.g., Ti/TiN.

Figure 6:
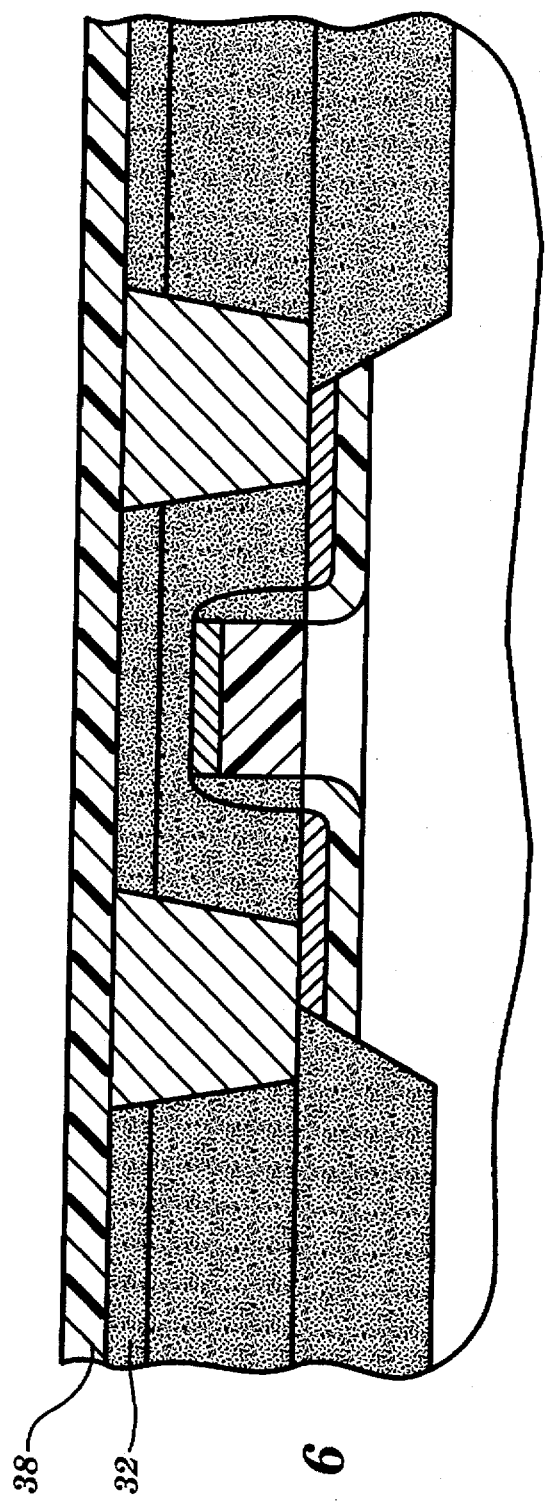

After the studs are formed, a layer of amorphous polysilicon 38, sometimes referred to as the "body polysilicon", is applied over cap oxide layer 32 and over the exposed upper surface of the studs, as depicted in FIG. 6. This polysilicon layer, which will eventually be patterned to form source and drain regions as described below, is usually deposited by CVD or low-pressure CVD (LPCVD) at a temperature of about 450° C. to about 550° C., and preferably, at a temperature in the range of about 475° C. to 525° C.

The deposited polysilicon layer is subjected to a recrystallization anneal at a temperature in the range of about 600° C. to about 650° C., and preferably, in the range of about 600° C. to about 625° C. The recrystallization annealing treatment transforms what is initially amorphous silicon into crystalline silicon, thereby substantially increasing grain size. The treatment does not have to occur immediately after deposition; it can be carried out later in the SRAM fabrication sequence.

Other annealing techniques may be used. For example, rapid thermal annealing (RTA) may be carried out at about 800° C.–850° C. for about 5–15 seconds. After annealing, polysilicon layer 38 usually has a thickness in the range of about 400 Angstroms to about 1000 Angstroms, and preferably, in the range of about 600 Angstroms to about 700 Angstroms.

In some embodiments, polysilicon layer 38 is subjected to a threshold voltage ($V_t$) implant, which simply serves as an adjustment to the threshold voltage, based on desired electrical characteristics. Choice of a dopant will depend on the particular FET device being manufactured. Arsenic or phosphorous is usually the implanted ion for a p-FET device, while boron is usually used for an n-FET device. The dopant impurity level is usually not very high, e.g., about $10^{15}$ atoms per cc to about $10^{18}$ atoms per cc.

Techniques for implanting the dopant are well-known in the art and described, for example, in the following references: *Microelectronics*, by J. Millman, McGraw-Hill, 1979; *Fundamentals of Semiconductor Devices*, by E. S. Yang, McGraw-Hill, 1978; and *VLSI Technology*, S.M. Sze (Ed.), McGraw-Hill, 1988. An ion implanter is typically employed for the actual implantation. An inert carrier gas such as nitrogen is usually used to bring in the impurity source, e.g., diborane, phosphine, or arsine.

Figure 7:
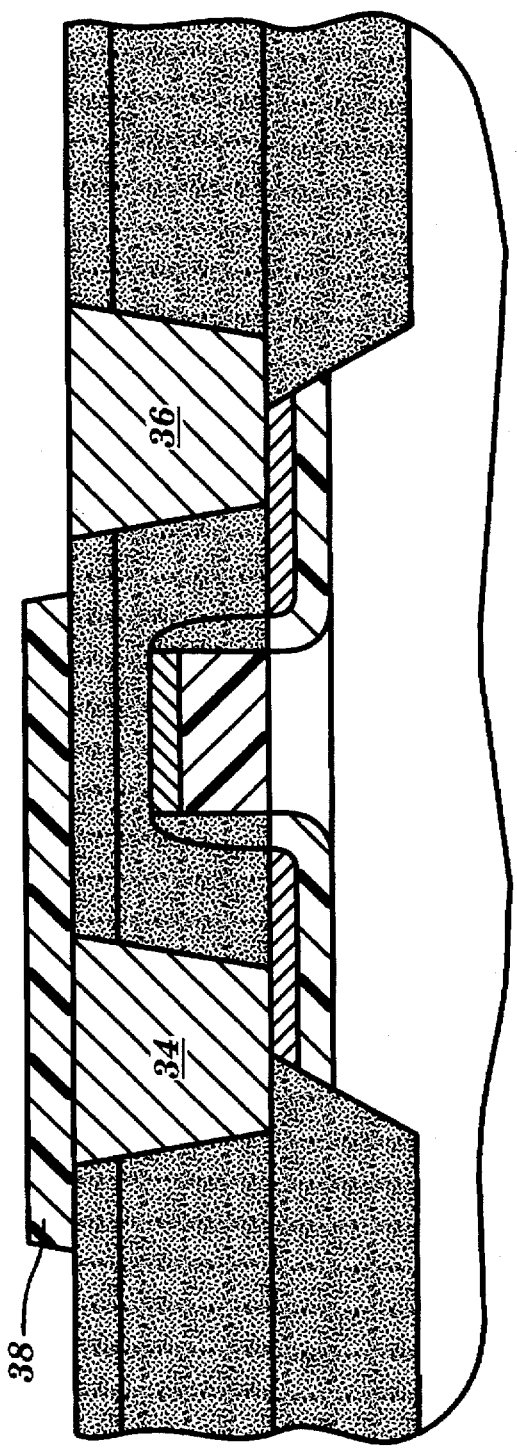

Next, polysilicon layer 38 is patterned and etched to open up contact with the stud. FIG. 7 depicts the surface of one stud (36) being exposed in this step. However, both studs could be exposed, depending on the electrical configuration desired for the particular device. Again, standard patterning and etching techniques can be employed, such as those described in *Introduction to Microlithography*, Edited by L. Thompson et al, ACS Symp. Series 219, Amer. Chem. Soc., 1983.

Figure 8:
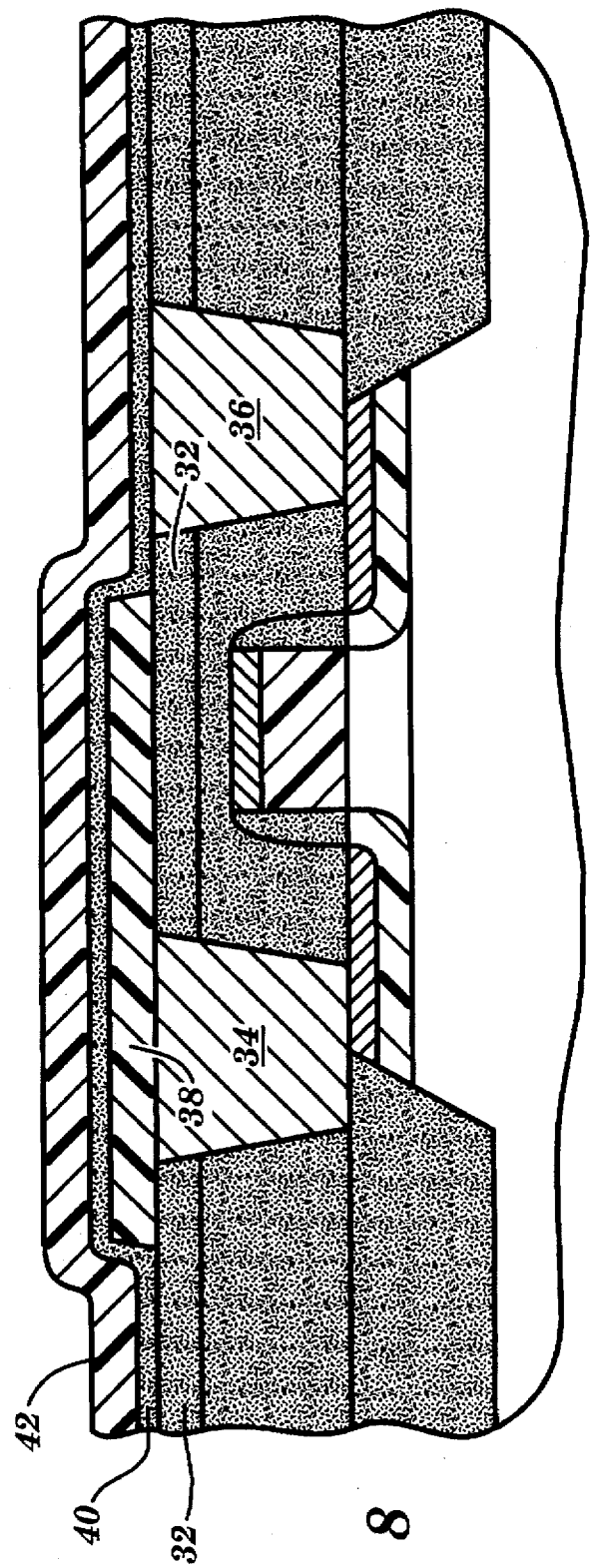

Dielectric layer 40 (the "gate dielectric" layer) is then formed over polysilicon layer 38 and the exposed surfaces of cap oxide layer 32 and stud 36, as shown in FIG. 8. (The dielectric layer would have also covered the surface of stud 34 if that stud had been patterned and exposed, as described above.) Layer 40 usually comprises an oxide material, and can be deposited by CVD, for example. Deposition is carried out at a temperature in the range of about 400° C. to about 500° C., and preferably, in the range of about 450° C. to about 500° C. Layer 40 is required to obtain the "field" necessary for FET devices, and usually has a thickness in the range of about 100 Angstroms to about 400 Angstroms.

A second polysilicon layer 42 is then deposited over dielectric layer 40, as shown in FIG. 8. Layer 42 provides the basis for the gate 42A of the TFT, as described below. As in the case of layer 38, CVD or LPCVD is usually used to deposit the polysilicon, at a deposition temperature of about 600° C. to about 650° C., and preferably, at a temperature in the range of about 600° C. to about 630° C. Layer 42 usually has a thickness of about 1000 Angstroms to about 2000 Angstroms. Layer 42 may be doped during its deposition, or implanted with dopant atoms afterwards, to impart the appropriate conductivity. P-type doping is utilized for p-FET's, while n-type doping is used for n-FET's. The doping concentration is usually in the range of about $10^{19}$ to about $10^{20}$ atoms/cc.

Figure 9:
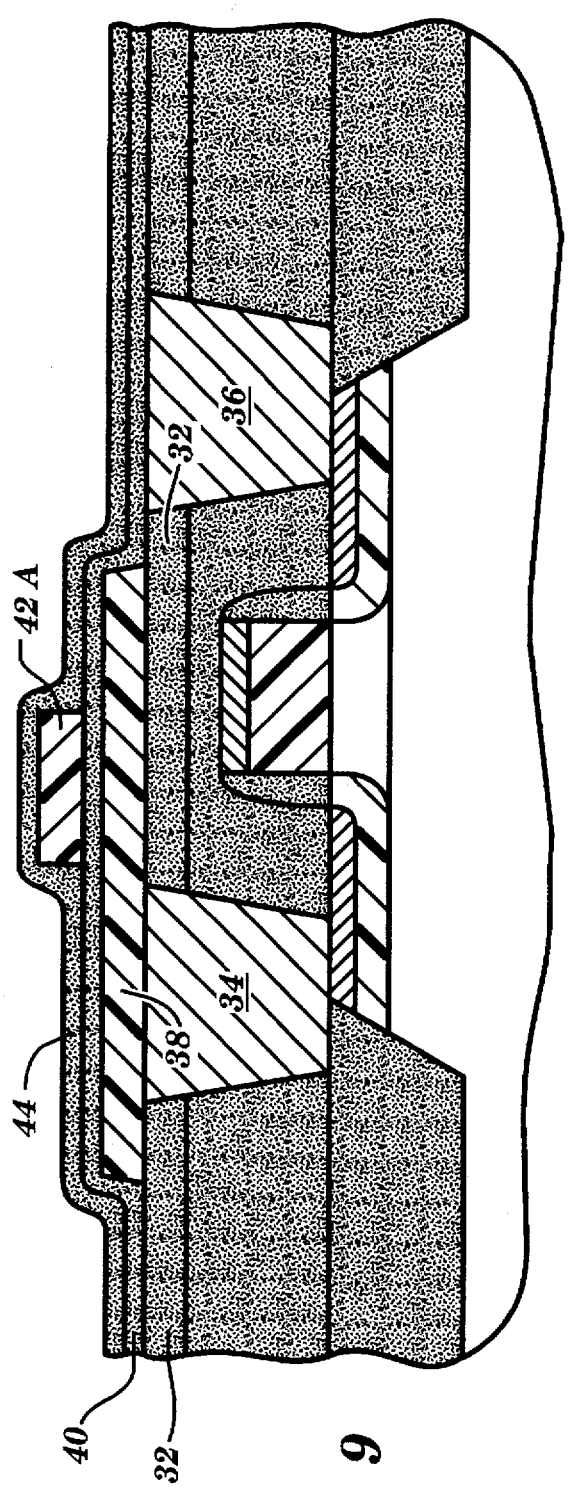

Polysilicon layer 42 is then imaged and etched by conventional processes to form gate 42A, as depicted in FIG. 9. The dimensions of the gate will of course be determined by the desired requirements for the FET. The operation of the gate in a typical FET, e.g., a metal oxide semiconductor FET (MOSFET), is well-known and described, for example, in the Millman text mentioned above. The gate serves as a mask for implanting the source and drain regions of layer 38, as described further on in this disclosure.

Another dielectric layer 44 is then applied over the exposed surface of gate 42A, as well as the exposed surface of dielectric layer 40. Layer 44 is typically an oxide material, and can be applied by the conventional means discussed above, e.g., CVD at a temperature in the range of about 400° C. to about 500° C., and preferably, in the range of about 450° C. to about 500° C. It usually has a thickness of about 100 Angstroms to about 400 Angstroms.

Implantation of gate 42A and regions 38A and 38B of layer 38 with a suitable dopant can be effected by known techniques, such as those described above. Implantation will occur in a substantially perpendicular direction through dielectric layer 44. As in the case of the $V_t$ implant, arsenic or phosphorous is usually used for a FET of the p-channel type, while boron is usually used for an FET of the n-channel type. As an example, boron (in atomic form) can be implanted with a standard ion implanter, utilizing a voltage in the range of about 5 KeV to about 10 KeV. The concentration of dopant atoms implanted depends on the electrical characteristics desired for the particular FET, and is usually in the range of about $10^{19}$ atoms per cc to about $10^{20}$ atoms per cc. In preferred embodiments, the dopant concentration is about 10 atoms per cc.

A heat treatment is often used after implantation, and serves to activate the dopant ions. An anneal for about 60 minutes to about 90 minutes at a temperature in the range of about 600° C. to about 650° C. is preferred. Alternatively, the RTA treatment described above could be employed.

Figure 10:
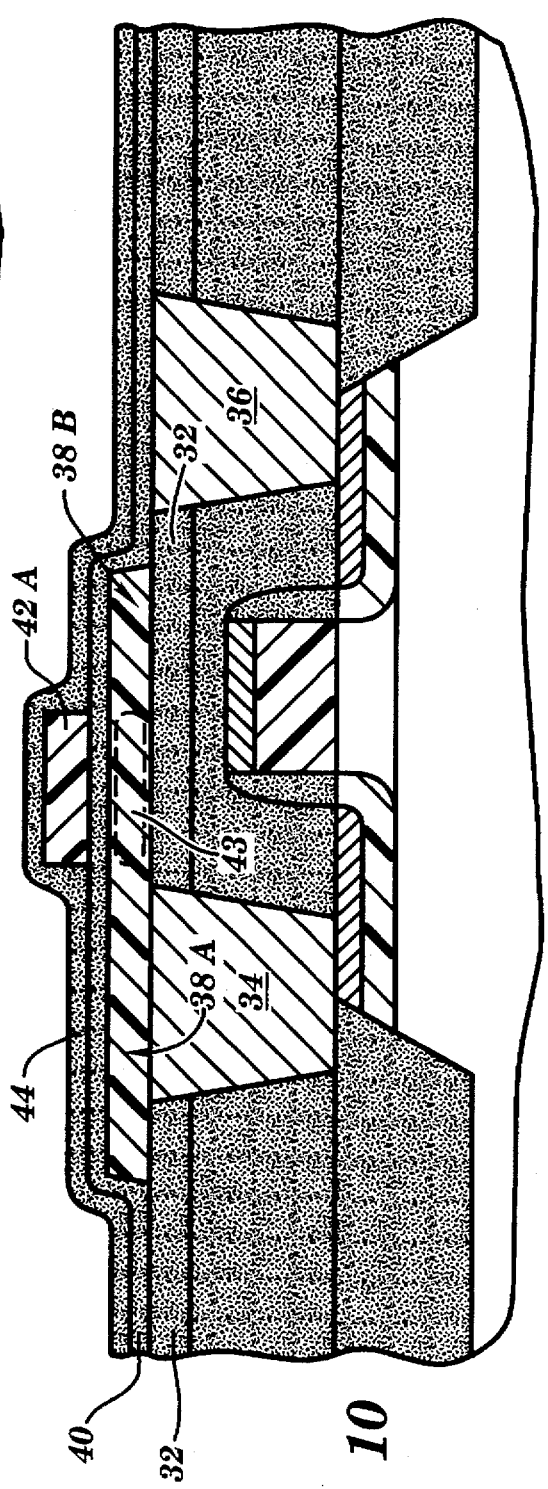

One embodiment of a completed semiconductor device based on the present invention is depicted in FIG. 10. A TFT, formed by source/drain regions 38A, 38B; gate 42A, and channel 43, is situated on top of cap oxide layer 32, and is in direct contact with stud 34 via region 38A. (As mentioned above, stud 36 could alternatively have been directly connected to the TFT, via region 38B, for example). The ability to place the source/drain area directly over a stud contact provides a density advantage, because the conventional single-crystal p-FET can be eliminated, e.g., in an SRAM.

Another key aspect of the invention is also shown in FIG. 10. The TFT is self-aligned to the gate. In other words, the facing edges of source and drain regions 38A, 38B are lined up perpendicularly with the outer, perpendicular edges of gate 42A, thereby defining the length of channel 43, due to the direction of implant during the doping step. Self-alignment is important in minimizing current loss and ensuring good on-off characteristics, i.e., an on-off current ratio of at least about $10^3$, and preferably, at least about $10^4$, at a gate voltage ($V_g=V_{ds}$) of about 2.5 to 3.5 volts.

Figure 11:
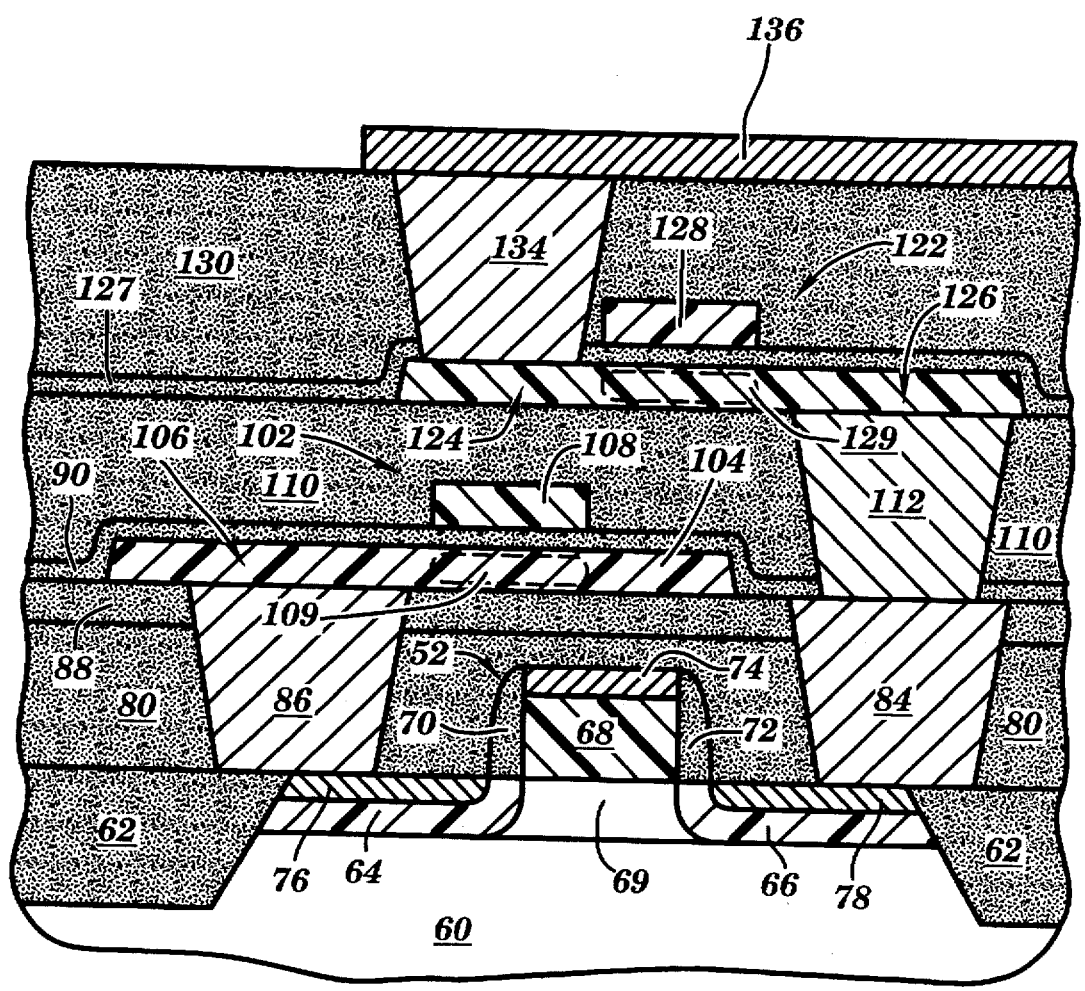
FIGS. 11 and 12 are cross-sections of other exemplary FET structures based on the present invention, utilizing multiple levels of TFT's, pillars, and/or interconnection layers.

Another embodiment of the present invention is depicted in FIG. 11. TFT devices are "stacked" over active devices situated on a silicon substrate 60, within oxide layer 62. Base circuit element 52 is an example of such an active device. It is usually an FET, as shown here. Thus, in the figure, FET 52 includes the various features described above, i.e., gate 68, channel 69, and source/drain regions 64, 66, as well as spacers 70, 72. Metallized regions are also included, i.e., regions 74, 76, and 78, which are often formed of a silicide, such as titanium silicide or cobalt silicide. Manufacturing procedures for the FET's and the studs described below are generally identical to the procedures set forth above for other embodiments.

Primary level studs 84 and 86 are each directly connected to either the source or drain region of circuit element 52. As shown, each stud is in contact with either metallized region 76 or 78. However, as described previously, the studs do not have to be in contact with any portion of the active device, and can instead simply terminate in various portions of oxide layer 62.

The top surface or "terminus" of the primary level studs can contact a secondary level stud or another active device. As illustrated in the exemplary embodiment of FIG. 11, primary level stud 84 makes contact through undoped cap oxide layer 88 and dielectric layer 90 with at least a portion of the bottom surface of secondary level stud 112. The studs can be connected by various techniques, with the proviso that electrical conductivity between the studs is maintained, and that the connection means does not adversely affect the surrounding semiconductor structure in any way. One suitable means of connection (not shown in the figure) utilizes a liner for the stud, deposited in each stud recess prior to stud formation. A non-limiting example of such a liner (or "bonding layer") is the Ti/TiN layer structure described previously. In this particular situation, the TiN-type layer contacts all or a portion of the bottom surface of subsequently-formed stud 112. It functions as a barrier layer, preventing the undesirable etching of silicon surfaces by components in the deposition gasses, e.g., the fluorine in $WF_6$.

With continued reference to the exemplary embodiment of FIG. 11, it can be seen that primary level stud 86 contacts an active portion of primary level TFT 102. The figure shows connection through source/drain region 106, though connection is equally possible via source/drain region 104, if the position of the stud were shifted. The connection between stud 86 and source/drain region 106 is simply a polysilicon-to-metal contact, which is formed carefully, to prevent high resistance. The Ti/TiN-type liner structure could optionally be used to enhance electrical contact.

Primary level TFT 102 contains the typical TFT elements. Only some of the elements are specifically illustrated in FIG. 11, e.g., the source and drain regions, as well as gate 108 and channel 109 (shown by dashes). Direct connection of TFT 102 to one or both of the studs is an important aspect of this embodiment, as is the conservation of space in the semiconductor device. In regard to the second-mentioned point, the incorporation of TFT 102 above the base region, i.e., above the horizontal plane of base circuit element 52, frees up critically-needed space in the base region, without any decrease in the overall performance of the device.

Secondary level stud 112, formed through etched and patterned regions of oxide layer 110, can be connected to yet another vertical level of the device. As shown in FIG. 11, stud 112 can be connected to an active portion of secondary level TFT 122, i.e., to source/drain region 126. (As with the primary level studs, connection could be made equally well through source/drain region 124, if the position of the stud were shifted). Techniques for forming stud 112 and TFT 122 (and for connecting the two) are as described above.

It should be understood that stud 112 could alternatively be connected at it's upper terminus to interconnection metallization, e.g., a "global" metallization layer (sometimes referred to herein as a "metal interconnection layer"), connecting many active devices as determined by the specific circuit. Moreover, one or more additional studs could be formed at this level, i.e., generally parallel to stud 112. These additional studs could serve a number of functions. For example, they could provide connection from a primary level stud to secondary level TFT 122, or could connect primary level TFT 102 to another metallization layer. (It should also be understood that secondary level stud 112 could alternatively be connected at its lower terminus to one of the source/drain regions 104, 106 of TFT 102, if the position of the TFT or the stud were shifted.)

Secondary level TFT 122 usually contains the same general elements as the TFT's described above, e.g., source/drain regions 124, 126; dielectric layer 127, gate 128, and channel 129. (As with TFT 102, other standard features are omitted from the figure for the sake of brevity). As in the case of TFT 102, the placement of TFT 122 above the level of base transistor 52 preserves critical space at the base level.

FIG. 11 also depicts a tertiary level stud 134, formed through patterned and etched oxide layer 130, and connected as described previously to an active region of TFT 122, i.e., here, to source/drain region 124. The upper terminus of stud 134 can be connected to interconnection metallization layer 136. (Sometimes, the connection is enhanced by the use of a thin, intervening conductive layer (not shown), e.g., a layer of titanium deposited over the top surface of the stud.) Metallization layer 136 could be another global interconnection layer, connecting many active elements in the FET structure.

As in the situation for the lower levels, many variations are possible. For example, one or more additional tertiary level studs could be put into place. Metallization layer 136 could be replaced by an additional TFT, i.e., a tertiary level TFT, to which a tertiary stud could be attached. The remaining studs at that level could be connected (at their upper terminus) to other TFT's, or to a nearby metallization layer performing the same function as layer 136. In the instance in which layer 136 is metallization, it can be covered by a dielectric layer (not shown), as described previously.

Figure 12:
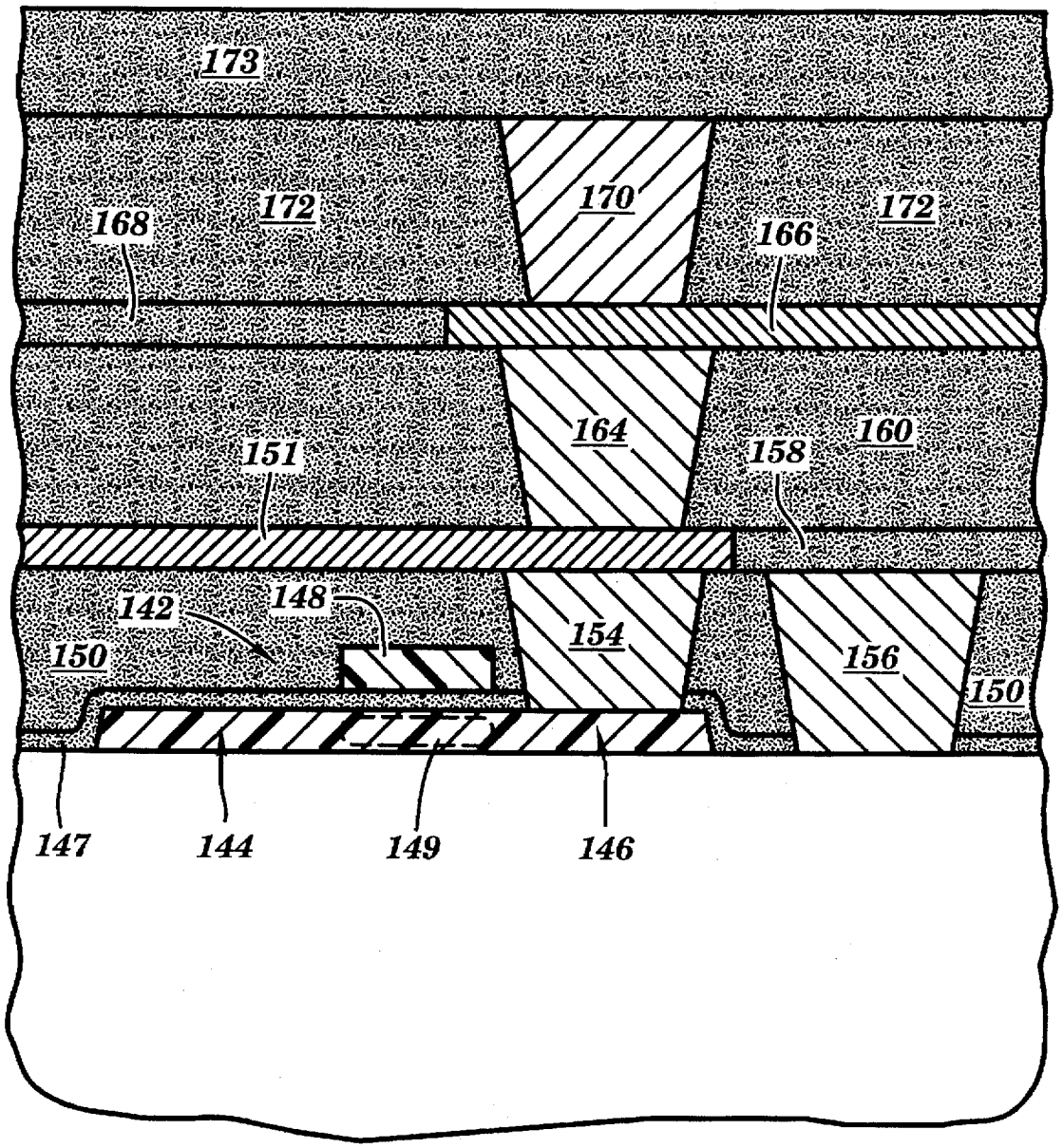

FIG. 12 depicts yet another embodiment of the present invention. For the sake of simplicity, the lower region of the device has been omitted from view, but is still part of this embodiment, i.e., the silicon substrate, the base circuit element, the primary level studs, and the surrounding oxide layer. The base of the figure begins at primary level TFT 142, which typically lies on top of an oxide layer (not shown). TFT 142 includes source/drain regions 144 and 146, dielectric layer 147, gate 148, and channel 149. Methods for making the TFT, as well as the materials used, are as described previously.

The lower terminus of secondary level stud 154 contacts TFT 142 via source/drain region 146 (but could make contact equally as well via source/drain region 144, as described previously for other embodiments). The lower terminus of secondary level stud 156 can make partial contact with an underlying oxide layer (not shown), and can also contact the upper surface of a primary level stud.

The upper surface of stud 154 may contact an interconnection metallization layer 151. Layer 151 typically connects many FET's or other devices throughout an integrated circuit. The layer is usually formed of aluminum or copper, with aluminum being preferred. It is typically a fine-line pattern, having a thickness in the range of about 0.5 micron to about 0.8 micron. CVD or LPCVD are usually employed to deposit the metallization. Particulars regarding the deposition are known in the art and described, for example, in the Sze text mentioned above, pages 375–421.

The upper terminus of stud 156 can contact oxide layer 158, which has been deposited over oxide layer 150 (and through which metallization layer 151 was formed by patterning and etching). As should be apparent from the discussion above, the presence or absence of stud 156 depends on the electrical and processing requirements of the FET structure. By the same token, a third or fourth stud may be placed at the level of studs 154 and 156, if desired for the particular structure. Methods for forming the studs and connecting them to various elements have already been described, along with suitable materials for the studs.

An additional stud, i.e., tertiary level stud 164, is also depicted in FIG. 12, and is formed through oxide layer 160. The bottom surface or terminus of the stud contacts metallization layer 151, while the upper terminus contacts another metal interconnection layer, i.e., layer 166, which is formed within patterned and etched regions of oxide layer 168. This secondary level metal interconnection performs the same general functions as the metallization at the primary level, i.e., layer 151, though of course providing electrical contact with different elements throughout the integrated circuit.

Element 170 of FIG. 12 represents yet another level in the FET structure. It is a quaternary level stud, patterned and etched through oxide layer 172. The stud has a lower terminus contacting secondary level metal layer 166. The upper terminus of the stud contacts layer 173, which represents various alternative elements, depending on the desired features for the FET structure, as discussed above. Thus, layer 173 may be a dielectric layer, or an additional layer of interconnection metallization.

Various other modifications of the embodiment set forth in FIG. 12 are of course possible. For example, additional studs could be emplaced at the tertiary and quaternary levels, i.e., generally parallel to studs 164 and 170, respectively. Some of those studs could be connected to additional FET's which could be situated in place of one or both of the metallization layers. As described above, the vertical "stacking" of FET's according to this invention conserves critical space at the base level of the FET structure.

Furthermore, additional metallization layers could be put into place, above and substantially parallel to layer 166 or layer 173. These additional layers would be suitably insulated from adjacent metallization by insulator layers, for example. They could be electrically connected to each other (when required) by studs which extend through each separating insulator layer. The metallization layers would provide appropriate interconnection to other features throughout a typical, high-density circuit.

As mentioned above, the FET structure of the present invention can constitute a portion of an SRAM memory cell. SRAM devices are known in the art and described clearly, for example, in the Sze text (*VLSI Technology*) provided above, as well as in U.S. Pat. Nos. 5,334,863; 5,278,459; and 5,156,987, all incorporated herein by reference. This type of memory cell usually includes six transistors. The bit-state information is stored in a pair of cross-coupled inverters. Incorporation of the TFT structure described herein can significantly reduce the size of an SRAM, by up to about 40%. Furthermore, the structure can be added to an SRAM cell in modular fashion, without requiring substantial modification of preexisting device characteristics.

Figure 13:
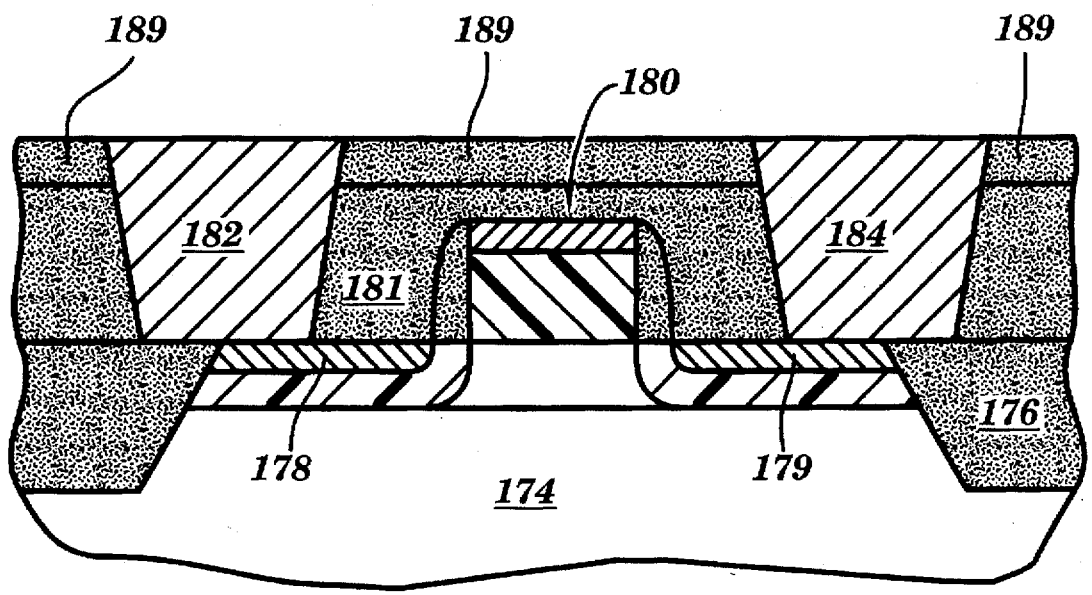
FIGS. 13–18 depict a cross-section of another FET structure based on the present invention, utilizing an interfacial cap over at least one of the studs.

An additional embodiment of the present invention includes the use of a protective interfacial layer, and is depicted in the sequence of figures beginning with FIG. 13. Base circuit element 180 is usually a transistor, but it could alternatively be a resistor, capacitor, diode, etc. Element 180 has been formed in recessed areas of oxide layer 176, which had initially been formed on silicon substrate 174. When element 180 is a transistor, it usually includes the conventional features, e.g., gate, channel, and source/drain regions. Those features are not specifically pointed out in FIG. 13 for the sake of brevity.

It can be seen that conductive regions 178 and 179 are in partial contact with the respective lower terminus of subsequently-formed metal studs 182 and 184. The studs, preferably formed of a refractory material like tungsten, are conventionally formed in etched regions of oxide layer 181.

Prior to deposition of the interfacial layer described below, it is sometimes desirable to etch the top surface of each stud, so that the studs are recessed below the top surface of oxide layer 181. The recesses are usually about 500 Angstroms to about 1000 Angstroms deep, and they permit the easy removal of extraneous interfacial material in a subsequent step, as described below.

Figure 14:
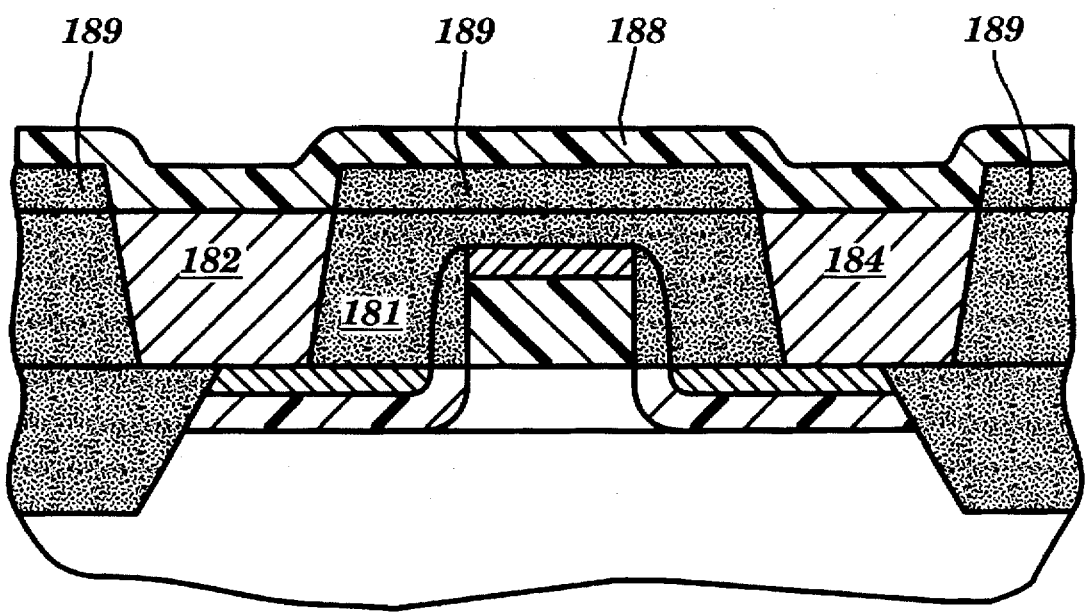

As depicted in FIG. 14, a polysilicon interfacial layer 188 is then applied over all of the exposed surfaces. As described previously, this layer can be deposited by conventional means, e.g., CVD or LPCVD. Layer 188 usually has a thickness in the range of about 500 Angstroms to about 1000 Angstroms. The purpose of interfacial layer 188 is to protect the subsequently-applied layer of polysilicon from direct connection with the stud.

Interfacial layer 188 is doped to the appropriate conductivity for the particular transistor which will eventually be formed above the layer. The dopant should obviously have the same conductivity as the source/drain region of the transistor. Thus, for a p-FET device, boron is implanted, while arsenic or phosphorous is usually used for an n-FET device. Doping can be performed in situ, e.g., by the incorporation of a compound like boron trifluoride into the silane gas flow being used to deposit a polysilicon interfacial layer. Alternatively, implanting after the formation of the interfacial layer is possible, e.g., with the use of a standard ion implanter, as described previously. The concentration of dopant atoms implanted depends on the electrical characteristics desired for the FET, and is usually in the range of about $10^{15}$ atoms per cc to about $10^{18}$ atoms per cc.

Because the studs are now capped with a protective, interfacial layer like polysilicon, conventional cleaning agents (which are often aggressive materials) can be used freely to reduce the amount of metallic contaminants, so that the subsequent polysilicon layer employed for TFT formation can be easily deposited without the spurious growths often associated with metallic studs. Examples of cleaning techniques used for this purpose include the "Huang A/B" technique, which is based on the use of mixtures of water/hydrogen peroxide/ammonium hyroxide and water/hydrogen peroxide/hydrochloric acid. Hydrofluoric acid treatments are also possible.

Figure 15:
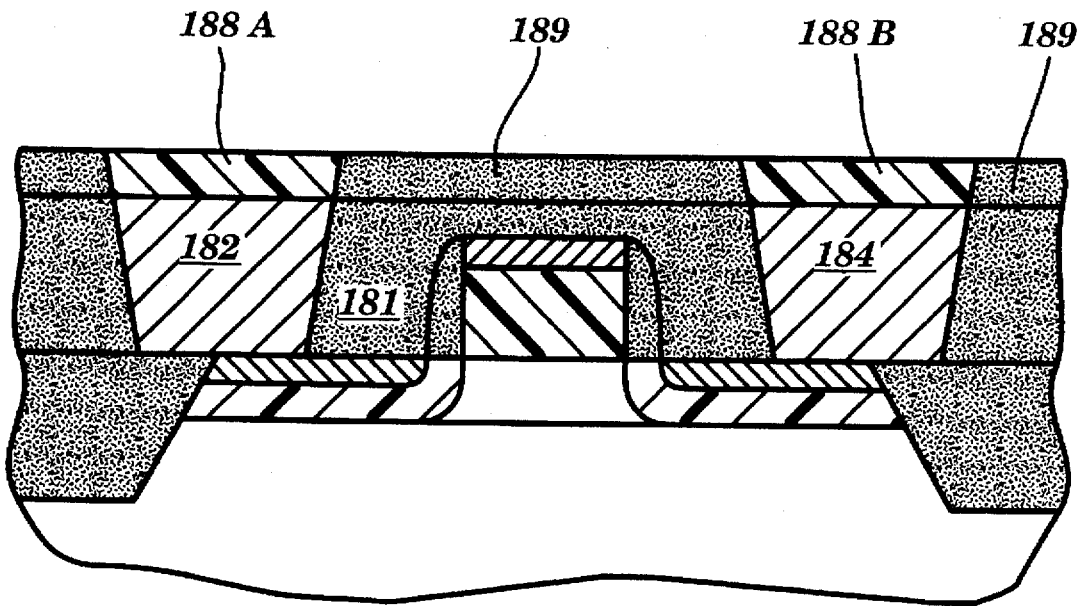

An appropriate etching and planarizing technique is then used to remove the interfacial material which contacted the surface of oxide layer 181, thereby leaving interfacial material only on the surfaces of studs 182 and 184. FIG. 15 depicts these remaining caps of material as elements 188A and 188B. The CMP technique described above is especially suitable for this purpose.

Figure 16:
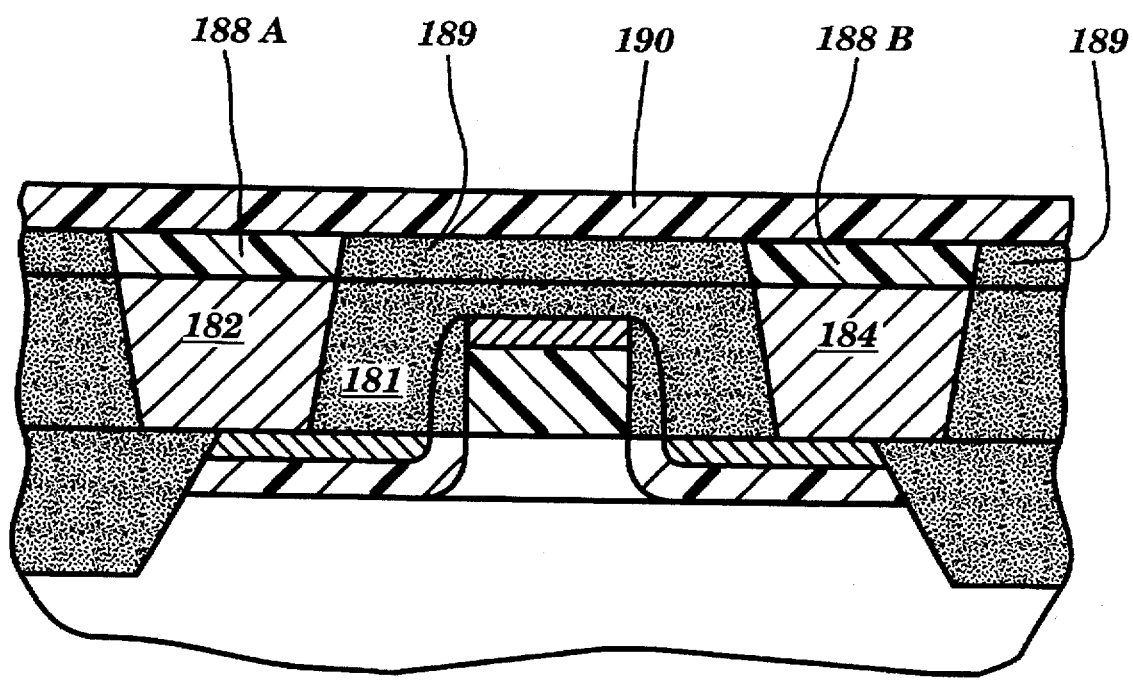

As shown in FIG. 16, an undoped cap oxide layer 189 can then be applied over the exposed surfaces of oxide layer 181 and interfacial caps 188A and 188B. This layer is analogous to cap layer 32 in FIG. 4, and prevents any phosphorous in the oxide layer from diffusing into the polysilicon layer which will subsequently be applied. Layer 189 is applied as described previously, e.g., by way of CVD, and usually has a thickness in the range of about 500 Angstroms to about 1500 Angstroms.

After deposition of cap oxide layer 189, an amorphous polysilicon layer 190 (the "body polysilicon") is applied. As described for previous embodiments, this layer will be patterned to form source and drain regions. After deposition, layer 190 is subjected to a recrystallization anneal treatment, also described above. The annealed layer has a thickness in the range described for layer 38 of FIG. 6.

The remaining steps according to this embodiment are similar to those described for the other embodiments. For example, polysilicon layer 190 may be subjected to a $V_t$ (threshold voltage) implant. The layer is then patterned and etched to open up contact with at least one of the studs (thereby removing the interfacial cap from that stud), e.g., stud 184 in FIG. 17.

Figure 17:
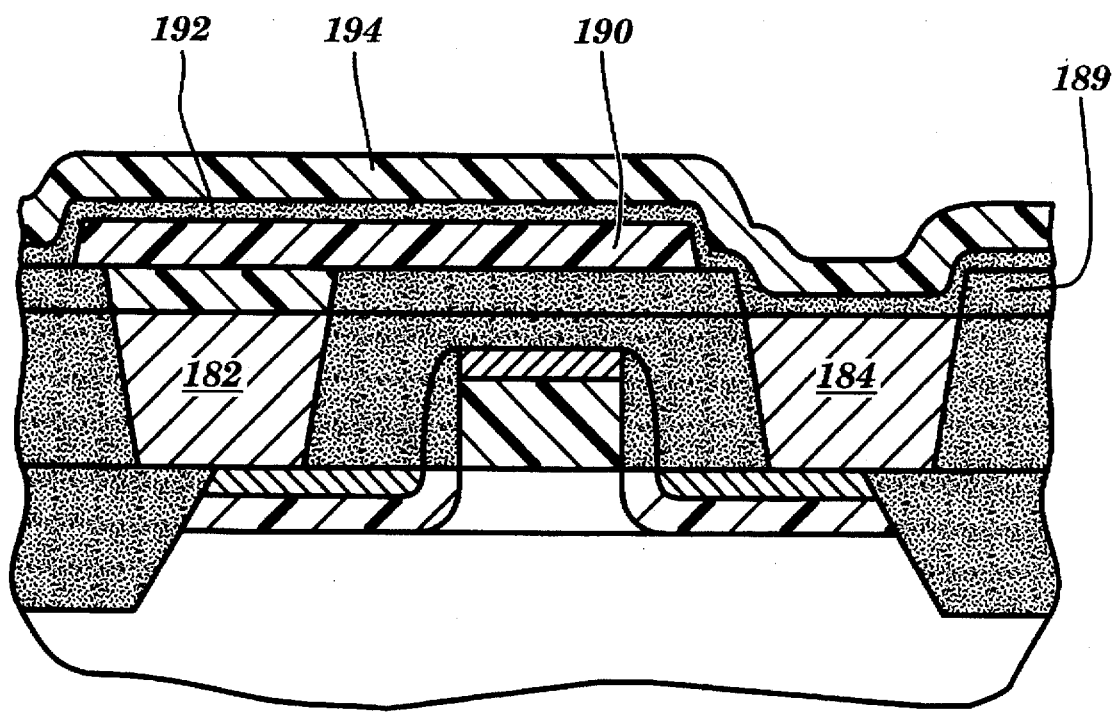
Figure 18:
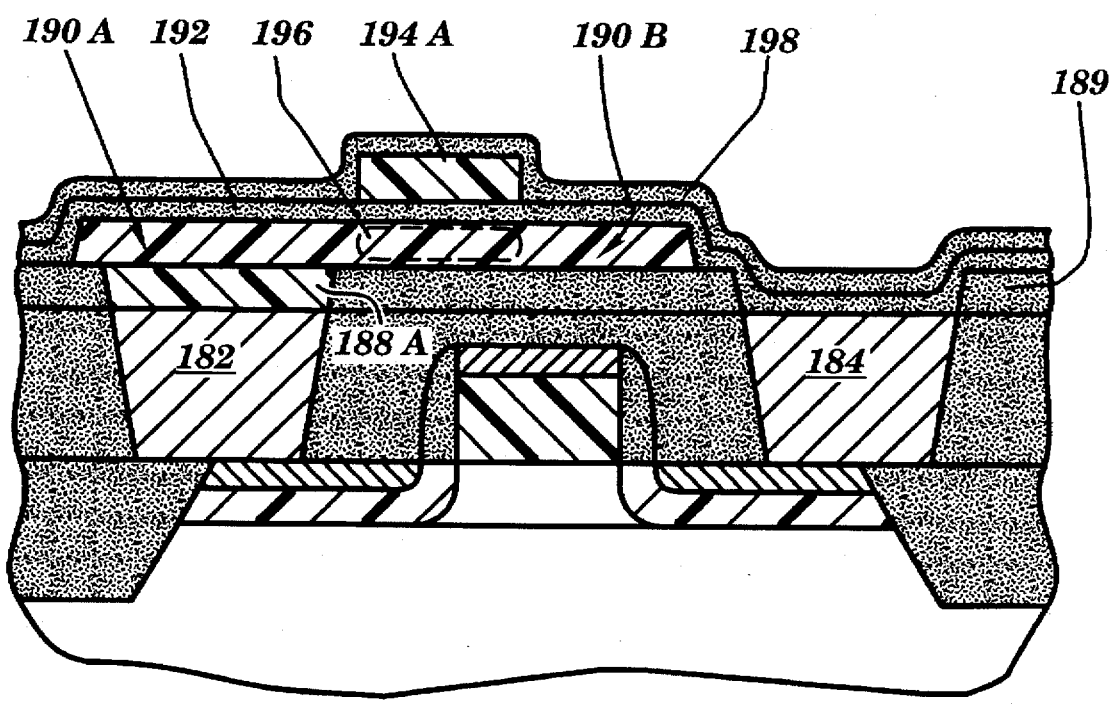

As shown in FIG. 17, dielectric layer 192 is then applied over all exposed regions of etched polysilicon layer 190 and stud 184, followed by the deposition of another polysilicon layer 194, which will provide the basis for the gate of the FET. Dielectric layer 192 usually has a thickness in the range of about 100 Angstroms to about 400 Angstroms, while polysilicon layer 194 usually has a thickness in the range of about 1000 Angstroms to about 2000 Angstroms. In a sequence analogous to those described previously, polysilicon layer 194 is then imaged and etched to form gate 194A, as depicted in FIG. 18. Again, the gate serves as a mask for implanting the source and drain regions of polysilicon layer 190. Another optional dielectric layer 198 may then be applied over the exposed surface of gate 194A, as well as the exposed surface of dielectric layer 192. This layer is typically an oxide material, and is applied as described above. It usually has a thickness in the range of about 100 Angstroms to about 200 Angstroms.

Implantation of gate 194A and regions 190A and 190B of polysilicon layer 190 is carried out as described above, with the usual selection of ions being made, depending on the channel type for the TFT. The concentration of dopant atoms implanted also depends on the electrical characteristics desired for the particular TFT, and is usually in the ranges described above for the previous embodiments. Furthermore, a heat treatment is also often used after implantation, as described previously.

An example of this particular type of embodiment is depicted in FIG. 18, in which the TFT, formed by source/drain regions 190A, 190B; gate 194A, and channel 196, is situated on top of undoped cap oxide layer 189. Interfacial cap 188A completely covers the top surface of stud 182.

It should be understood that the FET structure of this embodiment can be modified and enlarged in a manner similar to that for the other embodiments. In other words, additional levels of studs and TFTs can be built on top of the structure, as described, for example, in the embodiment of FIG. 11. Thus, one or more studs could be formed, connecting at their lower terminus to either region 190A or 190B of the TFT depicted in FIG. 18. The upper terminus of one or more of these studs could in turn be connected to the lower surface of a source/drain region of another TFT disposed over the stud. Additional layers of studs, TFTs, or metal interconnection layers (as depicted in FIG. 12) could also be incorporated. This embodiment also includes the attributes associated with the other embodiments, e.g., self-alignment of each TFT to its corresponding gate; as well as the ability to place the source/drain area of each of the TFTs directly over a stud contact.

It should be apparent from the preceding description that another aspect of the present invention is directed to a method of preventing the diffusion of impurity ions from an insulator layer in a field effect transistor (FET) structure to a subsequently-formed body-polysilicon layer which is to be patterned into a thin film transistor. The method comprises the application of an undoped cap oxide layer over the surface of the insulator layer, prior to formation of the body-polysilicon layer, as described previously.

Still another embodiment of the present invention involves a method of protecting metallic studs situated within an oxide layer in a field effect transistor structure from chemical agents which are normally degradative of the metallic material. This particular method comprises the application of a polysilicon interfacial or "cap" layer on the exposed surface of the studs prior to deposition of subsequent materials utilized to form the transistor structure, as described above.

Other modifications and variations of this invention are possible in view of the description thus provided. It should be understood, therefore, that changes may be made in the particular embodiments shown which are within the scope of the invention defined in the appended claims.

All of the patents, articles, and texts mentioned above are incorporated herein by reference.

We claim:
1. A field effect transistor (FET) structure, comprising:
   a) a first insulator layer containing at least one primary level stud extending through the layer;
   b) an undoped cap oxide layer disposed over the insulator layer, and abutting the upper region of each stud;
   c) a primary level thin film transistor (TFT) disposed over the undoped cap oxide layer; and
   d) a planarized dielectric layer disposed over the thin film transistor.

2. The structure of claim 1, wherein the primary level TFT comprises:
   c1) doped polysilicon source and drain regions disposed over a portion of the cap oxide layer and over the exposed upper surface of the metallic stud, wherein the source and drain regions are separated from each other by a channel;
   c2) a gate dielectric layer disposed over the channel, source, and drain regions; and
   c3) a transistor gate electrode disposed over a portion of the gate dielectric layer, and substantially self-aligned with the channel.

3. The structure of claim 1, wherein the first insulator layer comprises an oxide, a nitride, or glass material.

4. The structure of claim 1, wherein the metallic stud comprises tungsten, or an alloy of tungsten.

5. The structure of claim 1, wherein the dielectric layer of component (d) comprises CVD oxide.

6. The structure of claim 2, wherein the source and drain regions are formed from an amorphous polysilicon layer.

7. The structure of claim 2, wherein the source and drain regions exhibit P+ conductivity.

8. The structure of claim 1, wherein the lower terminus of the stud is connected to an active electrical device.

9. The structure of claim 1, wherein the lower terminus of the stud is embedded in an insulator material.

10. The structure of claim 1, wherein at least one secondary level stud is attached at its lower terminus to an upper surface of a primary level stud.

11. The structure of claim 10, wherein attachment between the primary level stud and the secondary level stud is made by a bonding layer which comprises titanium.

12. The structure of claim 2, wherein at least one secondary level stud is attached at its lower terminus to at least one of the polysilicon source or drain regions of component (c1).

13. The structure of claim 12, wherein the secondary level stud is attached at its upper terminus to a first metal interconnection layer.

14. The structure of claim 13, comprising a plurality of additional metal interconnection layers, substantially parallel to and vertically disposed over the first metal interconnection layer, and separated from each other by additional insulator layers.

15. The structure of claim 14, wherein the secondary level stud is attached at its upper terminus to a source or drain region of a secondary-level thin film transistor.

16. The structure of claim 15, wherein a tertiary level stud is attached at its lower terminus to a source or drain region of the secondary level thin film transistor, and is attached at its upper terminus to either a metal interconnection layer or to the source or drain region of a tertiary level thin film transistor.

17. The structure of claim 1, wherein the studs are substantially cylindrical in shape, and have diameters in the range of about 0.4 micron to about 0.8 micron.

18. The structure of claim 2, wherein a protective, interfacial layer of doped polysilicon is disposed between the lower surface of the source and drain regions and the upper surface of the primary level stud, covering the surface of the stud.

19. A field effect transistor (FET) structure, comprising:

a) a first insulator layer containing at least one primary level stud extending through the layer;

b) an undoped cap oxide layer disposed over the insulator layer, and abutting the upper region of each stud;

c) a primary level thin film transistor (TFT) disposed over the undoped cap oxide layer, said TFT itself comprising:

c1) doped polysilicon source and drain regions disposed over a portion of the cap oxide layer and over the exposed upper surface of the stud, wherein the source and drain regions are separated from each other by a channel;

c2) a second insulator layer disposed over the channel, source, and drain regions; and c3) a transistor gate electrode disposed over a portion of the second insulator layer, and substantially self-aligned with the channel, wherein a protective, interfacial layer of doped polysilicon is disposed between the lower surface of the source and drain regions and the upper surface of the primary level stud, covering the surface of the stud; and d) a planarized dielectric layer disposed over the TFT.

20. The structure of claim 19, wherein at least one secondary level stud is attached at its lower terminus to at least one of the polysilicon source or drain regions of component (c1).

21. The structure of claim 20, wherein the secondary level stud is attached at its upper terminus to a first metal interconnection layer.

22. The structure of claim 21, comprising a plurality of additional metal interconnection layers, substantially parallel to and vertically disposed over the first metal interconnection layer, and separated from each other by additional insulator layers.

23. The structure of claim 22, wherein the secondary level stud is attached at its upper terminus to a source or drain region of a secondary-level thin film transistor.

24. The structure of claim 23, wherein a tertiary level stud is attached at its lower terminus to a source or drain region of the secondary level thin film transistor, and is attached at its upper terminus to either a metal interconnection layer or to the source or drain region of a tertiary level thin film transistor.

* * * * *